United States Patent [19]

Yamashita

[11] Patent Number: 5,530,250

[45] Date of Patent: Jun. 25, 1996

[54] ELECTRON BEAM DEFLECTING APPARATUS WITH REDUCED SETTLING TIME PERIOD

[75] Inventor: Hiroshi Yamashita, Tokyo, Japan

[73] Assignee: NEC Corporation, Tokyo, Japan

[21] Appl. No.: 325,871

[22] Filed: Oct. 19, 1994

[30] Foreign Application Priority Data

Oct. 20, 1993 [JP] Japan .................................. 5-286102
Nov. 17, 1993 [JP] Japan .................................. 5-287896

[51] Int. Cl.$^6$ ........................ H01J 37/10; H01J 37/147
[52] U.S. Cl. ................ 250/356 R; 250/356 MC; 250/492.2
[58] Field of Search ................ 250/396 R, 396 ML, 250/358, 492.2

[56] References Cited

U.S. PATENT DOCUMENTS

| | | | |
|---|---|---|---|
| 3,699,304 | 10/1972 | Baldwin et al. | 250/397 |
| 4,607,333 | 8/1986 | Yasutake et al. | 250/398 |
| 4,853,870 | 8/1989 | Yasutake et al. | 250/396 R |
| 5,134,300 | 7/1992 | Kai et al. | 250/492.2 |
| 5,180,920 | 1/1993 | Kai et al. | 250/492.2 |
| 5,225,684 | 7/1993 | Taki et al. | 250/492.2 |
| 5,404,018 | 4/1995 | Yasuda et al. | 250/492.22 |

FOREIGN PATENT DOCUMENTS 64-27150  1/1989  Japan .

OTHER PUBLICATIONS

Y. Takahashi et al., "Electron beam lithography system with new correction techniques", *J. Vac. Sci. Technol. B*, vol. 10, No. 6, Nov./Dec. 1992, pp. 2794–2798.

*Primary Examiner*—Bruce C. Anderson
*Attorney, Agent, or Firm*—Sughrue, Mion, Zinn, Macpeak & Seas

[57] ABSTRACT

In an electron beam deflecting apparatus including an electromagnetic deflection unit and a driver for driving the electromagnetic deflection unit in accordance with a main deflection amount, when a current main deflection amount is different from a previous main deflection amount, a corrected main deflection amount, which is an opposite value of the previous main deflection amount with respect to the current main deflection amount, is calculated as the main deflection amount.

11 Claims, 14 Drawing Sheets

ELECTRON BEAM DEFLECTING APPARATUS WITH REDUCED SETTLING TIME PERIOD

BACKGROUND OF THE INVENTION

1. Field of the Invention

The present invention relates to an electron beam deflecting apparatus having electromagnetic windings for deflecting an electron beam.

2. Description of the Related Art

An electron beam having an energy of about 5 to 50 keV is irradiated onto a resist layer coated on a mask substrate or wafer, and as a result, chemical reaction occurs in the resist layer to obtain a desired pattern of the resist layer. Since such an electron beam has a small radius of less than 0.1 μm, a scanning electron beam exposure system can be of a high resolution type. Also, since the electron beam can be deflected by a magnetic field and an electric field controlled by a computer, the scanning electron beam system is used to enhance the throughput of a lithography process of manufacturing super large scale integrated (LSI) circuits which are highly integrated and extremely precise.

In the above-mentioned scanning electron beam exposure system, the electron beam is deflected by a magnetic field generated from an electromagnetic deflection unit as well as an electric field generated from an electrostatic deflection unit. In the electromagnetic deflection unit where a desired current waveform is supplied to external windings, the circuit configuration therefor is simple, and the focus blur and the scanning distortion are superior as compared with the electrostatic deflection unit. Contrary to this, in the electrostatic deflection unit, energy required for deflection is small and the frequency charactersistics are excellent; however, the deflection voltage may be so large that high insulating and duration characteristics of the circuit configuration are required, and also, it is difficult to generate a desired voltage waveform. Thus, in general, the electromagnetic deflection unit is used for main deflection control, and the electrostatic deflection unit is used for sub deflection control for correcting errors and aberrations.

In a prior art electron beam deflecting method for an electromagnetic deflection unit and a driver for driving the electromagnetic deflection unit, the driver drives the electromagnetic deflection unit directly in accordance with a main deflection amount regardless of its previous main deflection amount. This will be explained later in detail.

In the above-mentioned prior art electron beam deflecting method, however, when the difference between the current main deflection amount and the previous main deflection amount is large, a settling time period in which the electron beam reaches approximately its target position is so large that the exposure time period becomes large.

In another prior art electron beam deflecting method, a deflection amount per one time is limited to smooth the motion of the electron beam (see JP-A-SHO64-27150). This also will be explained later in detail.

In the above-mentioned other prior art electron beam deflecting method, however, the reduction of the settling time period cannot be actually expected, and also, even a waste of time occurs particularly in the case of a low pattern density.

In a prior art electron beam deflecting apparatus, a differentiator is provided for detecting a differential value of a current flowing through the electromagnetic deflection unit, and this differential value is fed back to an electrostatic deflection unit, to thereby reduce the settling time period of the electromagnetic deflection unit (see Y. Takahashi et al., "Electron beam lithography system with new correction techniques", J. Vac. Sci. Technol. B 10(6), pp. 2794–2798, November/December 1992). This will be explained later in detail.

In the above-mentioned prior art electron beam deflecting apparatus, however, since the operation of the differentiator requires time, the exposure time becomes longer.

SUMMARY OF THE ENVENTION

It is, therefore, an object of the present invention to provide an electron beam deflecting apparatus having a reduced settling time period.

According to an aspect of the present invention, in an electron beam deflecting apparatus including an electromagnetic deflection unit and a driver for driving the electromagnetic deflection unit in accordance with a main deflection amount, when a current main deflection amount is different from a previous main deflection amount, a corrected main deflection amount, which is an opposite value of the previous main deflection amount with respect to the current main deflection amount, is calculated as the main deflection amount.

Also, according to another aspect of the present invention, when the current main deflection amount is different from the previous main deflection amount, a corrected sub deflection amount is calculated in accordance with the difference between the current main deflection amount and the previous main deflection amount, and is fed back to an electrostatic deflection unit.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art electron beam deflecting apparatuses (or methods) will be explained with reference to FIGS. 1 to 6.

Figure 1:
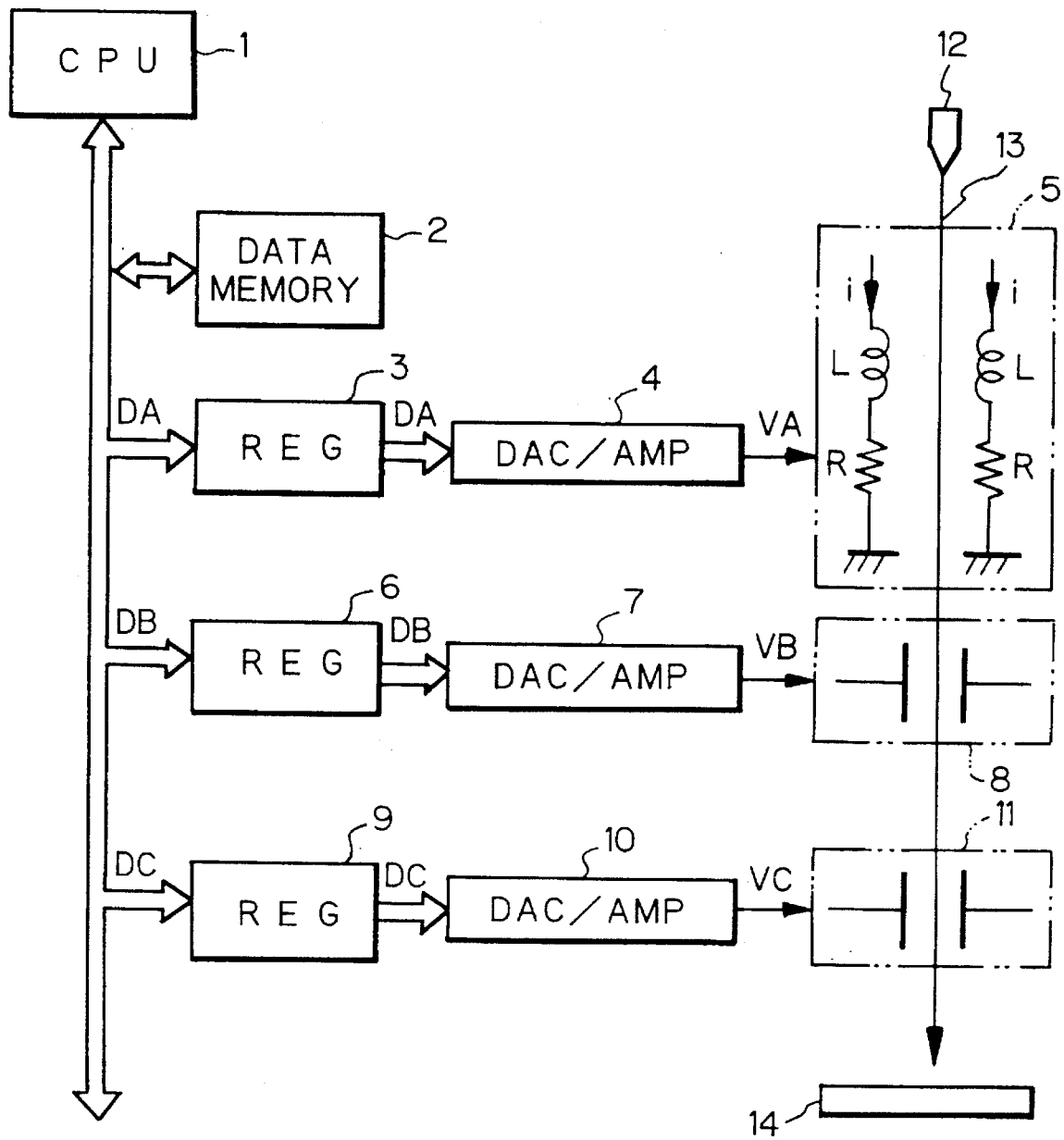
FIGS. 1 is a block circuit diagram illustrating a prior art electron beam deflecting apparatus.

In FIG. 1, which illustrates a prior art electron beam deflecting apparatus, reference numeral 1 designates a central processing unit (CPU) for controlling the entire apparatus of FIG. 1, and 2 designates a data memory for storing deflection data.

Figure 2A:
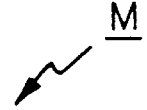
FIGS. 2A and 2B are diagrams showing examples of sub deflection areas and sub sub deflection areas, respectively.

Reference 3 designates a register for supplying a digital main deflection amount DA to a driver 4 formed by a digital/analog converter (DAC) and an amplifier. The driver 4 applies a voltage VA corresponding to the main deflection amount DA to an electromagnetic deflection unit 5 for defining one sub deflection area $S_{ij}$ (i, j=1~5) of a main deflection area M as shown in FIG. 2A.

Figure 2B:
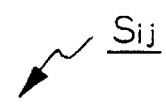

Reference 6 designates a register for supplying a digital sub deflection amount DB to a driver 7 formed by a digital/analog converter and an amplifier. The driver 7 applies a voltage VB corresponding to the sub deflection amount DB to an electrostatic deflection unit 8 for defining one sub sub deflection area $Q_{ij}$ (i, j=1~5) of a sub deflection area $S_{ij}$ as shown in FIG. 2B.

Reference 9 designates a register for supplying a digital sub sub deflection amount DC to a driver 10 formed by a digital/analog converter and an amplifier. The driver 10 applies a voltage VC corresponding to the sub sub deflection amount DC to an electrostatic deflection unit 11 for defining a position or shot within the sub sub deflection area $Q_{ij}$.

An electron gun 12 generates an electron beam 13. For example, the electron beam 13 has a variable rectangular shape formed by two apertures (not shown). The electron beam 13 passes through the electromagnetic deflection unit 5 and the electrostatic deflection units 8 and 11 to reach a target 14 which has deflection areas as shown in FIGS. 2A and 2B.

First, the electron beam 13 is deflected by the electromagnetic deflection unit 5 which receives the main deflection voltage VA, so that the electron beam 13 is irradiated onto a center of the sub deflection area $S_{11}$. Also, the electron beam 13 is deflected by the electrostatic deflection unit 8 which receives the sub deflection voltage VB, so that the electron beam 13 is irradiated onto a predetermined position of the sub sub deflection area $Q_{11}$. Then, the electron beam 13 is deflected by the electrostatic deflection unit 11 which receives the sub sub deflection voltage VC, so that the electron beam 13 is irradiated onto a predetermined area of the sub sub deflection area $Q_{11}$, thus completing an electron exposure upon the sub sub deflection area $Q_{11}$ of the sub deflection area $S_{11}$.

Next, a similar electron exposure for the sub sub deflection area $Q_{11}$ is performed upon the sub sub deflection areas $Q_{12}$, $Q_{13}$, ..., $Q_{55}$ of the sub deflection area $S_{11}$, sequentially, to thereby complete an electron exposure upon the sub deflection area $S_{11}$.

Next, a similar electron exposure for the sub deflection area $S_{11}$ is performed upon the sub deflection areas $S_{12}$, $S_{13}$, ..., $S_{55}$ to thereby complete an electron exposure upon the main deflection area M.

Particularly, in the electromagnetic deflection unit 5, when the voltage VA is applied thereto, a current i corresponding to the voltage VA flows through windings to create a magnetic field for the electron beam 13. That is, in this case, the electron beam 13 is deflected based upon Fleming's law.

Figure 3A:
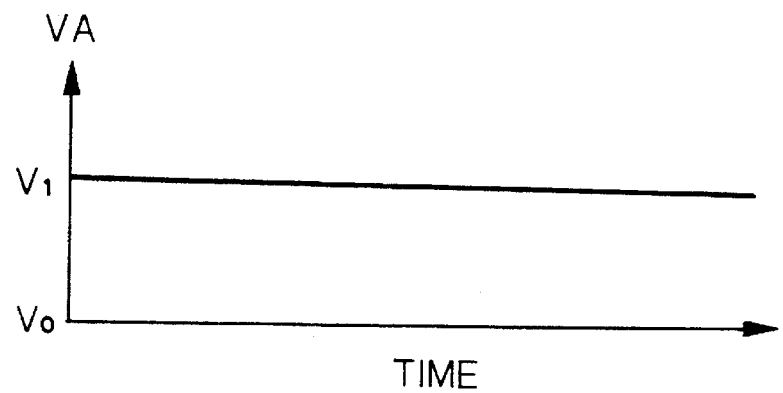
FIGS. 3A, 3B and 3C are timing diagrams showing the operation of the apparatus of FIG. 1.
Figure 3B:
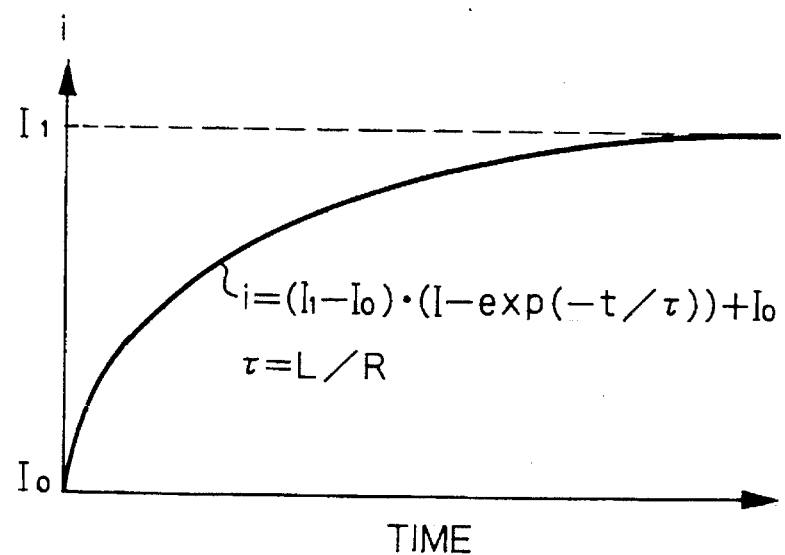
Figure 3C:
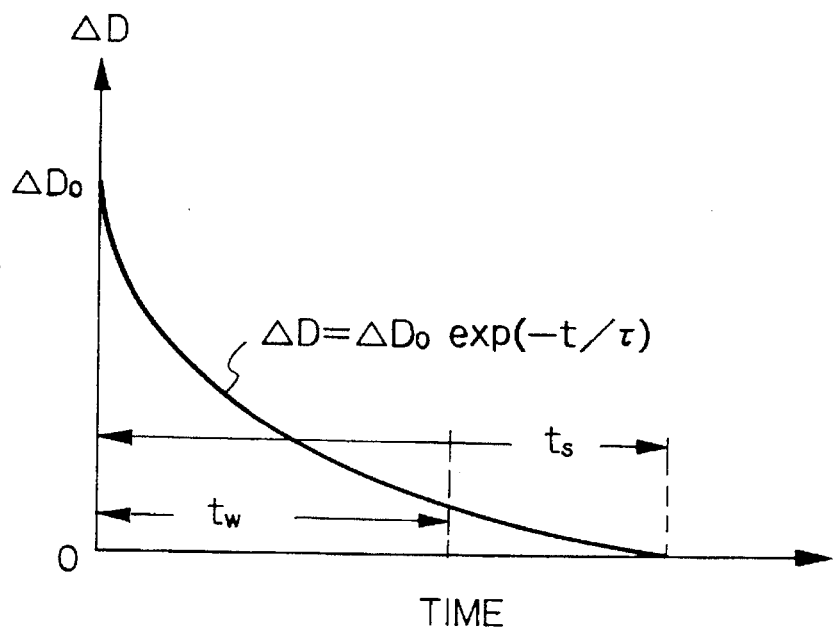

The above-mentioned electromagnetic deflection unit 5 has delay characteristics due to the eddy current effect, the transient phenomenon and the like. FIGS. 3A, 3B and 3C show a prior art electron beam deflecting method. That is, when the voltage VA applied to the electromagnetic deflection unit 5 is changed from $V_0$ to $V_1$ as shown in FIG. 3A, the current i flowing through the windings L and the resistors R is changed as shown in FIG. 3B. In this case, this current is represented by $$i=(I_1-I_0)\cdot(1-\exp(-t/\tau))+I_0 \qquad (1)$$

where $I_0$ and $I_1$ are currents flowing through the windings and the resistors of the electromagnetic deflection unit 5 in an equilibrium state when the voltages $V_0$ and $V_1$ are applied thereto; and $\tau$ is a time constant determined by the windings L and the resistors R of the electromagnetic deflection unit 5. In this case, a distance $\Delta D$ between a previous position of the electron beam 13 defined by the current $I_0$ and a current or aimed position of the electron beam 13 defined by the current $I_1$ is represented by $$\Delta D=\Delta D_0\cdot\exp(-t/\tau) \qquad (2)$$

as shown in FIG. 3C. Here, $\Delta D_0$ corresponds to a length of one of the sub deflection areas $S_{ij}$ of FIG. 2A, for example. Note that the delay characteristics due to the eddy current can be made negligible by selecting the material of the windings or the like.

That is, as shown in FIGS. 3A, 3B and 3C, it takes a settling time period $t_s$ for the electron beam 13 to reach approximately the target position. If a wait time period $t_w$ for defining a start of electron exposure is enough smaller than the settling time period $t_s$, deviation of electron exposure patterns may be created to reduce the manufacturing yield. Contrary to this, if the wait time period $t_w$ is very close to the settling time period $t_s$, the throughput is reduced. Thus, the wait time period $t_w$ is determined in accordance with the settling time period $t_s$.

However, when the distance $\Delta D$ is large, the settling time period $t_s$ becomes quite large, and therefore, the wait time period $t_w$ becomes so large that the exposure time period becomes large enough to reduce the throughput.

Figure 4A:
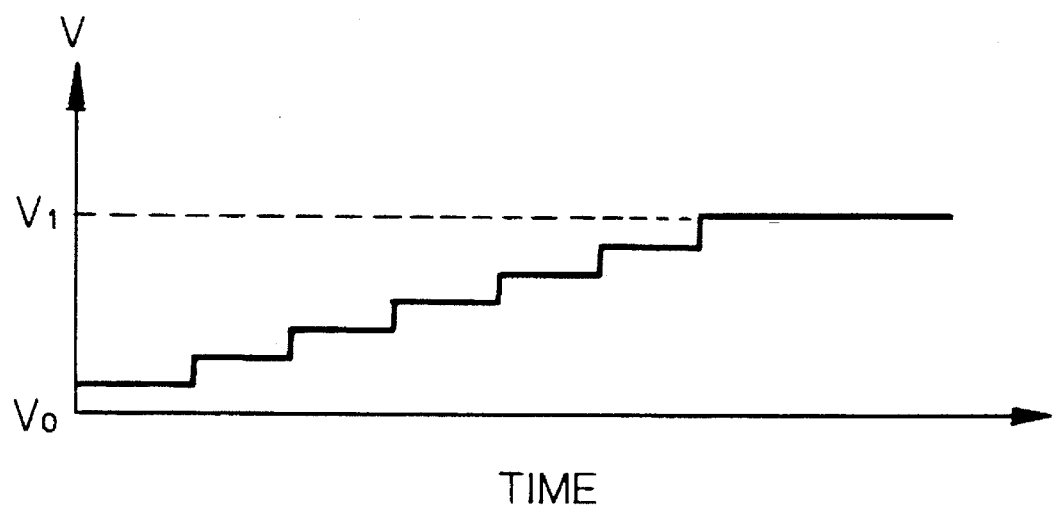
FIGS. 4A and 4B are timing diagrams showing the operation of the apparatus of FIG. 1.
Figure 4B:
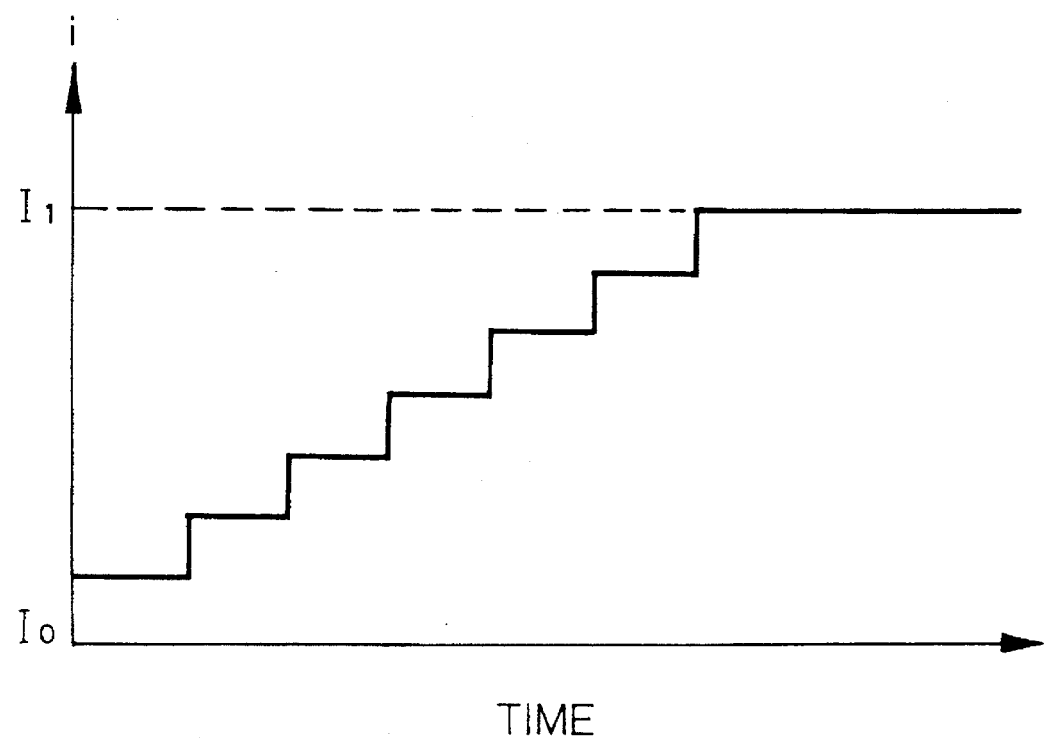

In FIGS. 4A and 4B, which show another prior art electron beam deflecting method, a change of the main deflection amount DA per one deflection, i.e., a change of the voltage VA per one deflection is limited to thereby reduce a stabilizing time period per one deflection (see JP-A-SHO64-27150).

In the electron beam deflecting method as shown in FIGS. 4A and 4B, the reduction of the settling time period $t_s$ cannot be expected. Also, even a waste of time is generated particularly in the case of a low pattern density.

Figure 5:
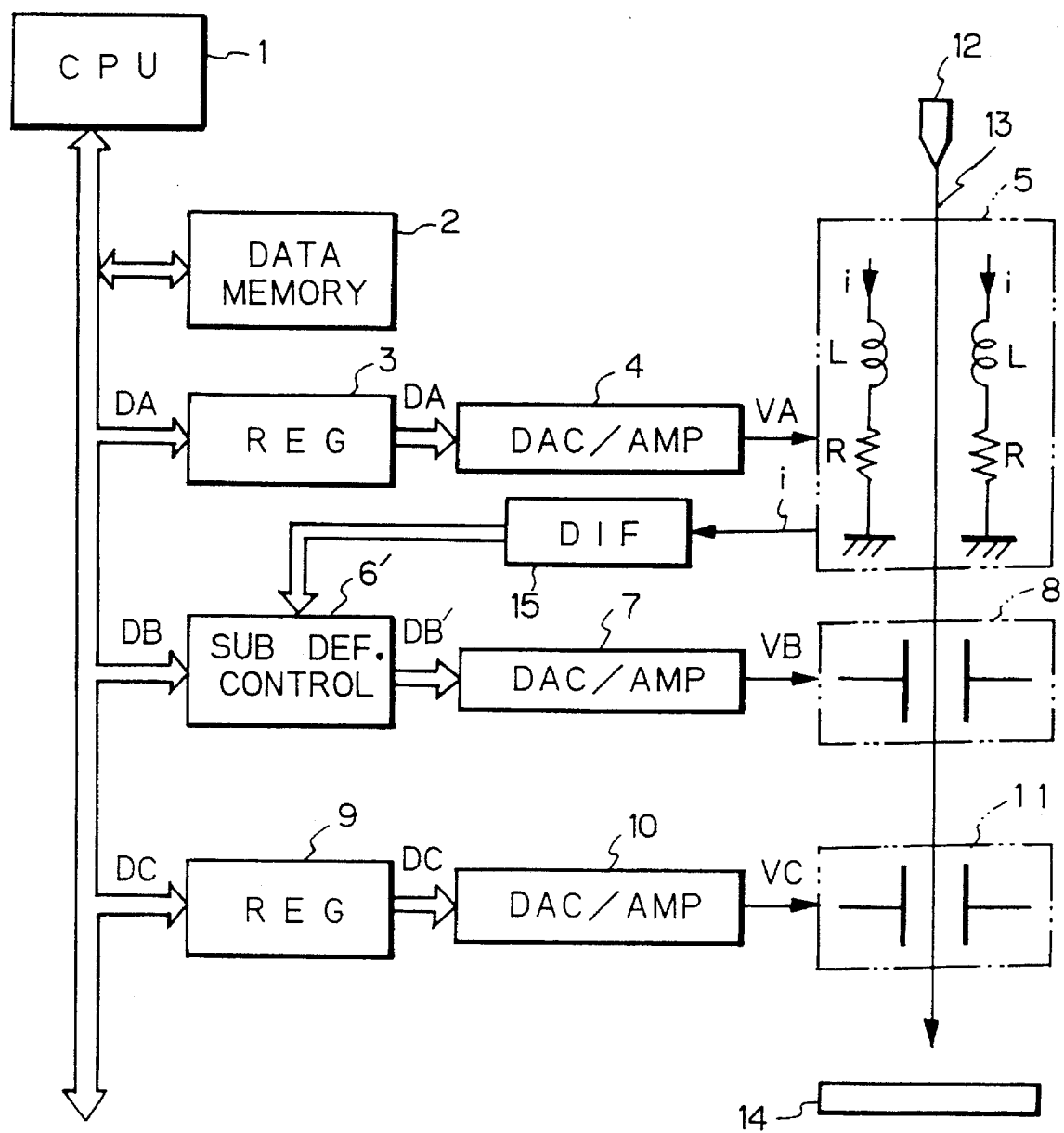
FIG. 5 is a block circuit diagram illustrating another prior art electron beam deflecting apparatus.
Figure 6:
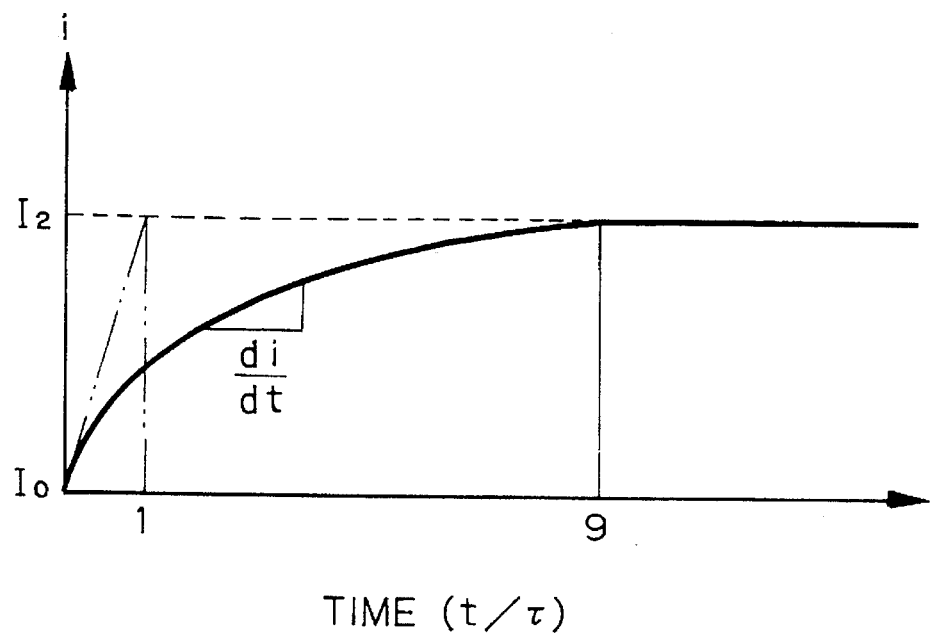
FIG. 6 is a timing diagram showing the operation of the apparatus of FIG. 5.

In FIG. 5, which illustrates another electron beam deflecting apparatus, a differentiator 15 for detecting the current i flowing through the windings L of the electromagnetic deflection unit 5 is added to the elements of FIG. 1, and a register 6 of FIG. 1 is modified into a sub deflection control circuit 6'. An output of the differentiator 15 is fed back via the sub deflection control circuit 6' and the driver 7 to the electrostatic deflection unit 8. That is, a settling time period $t_s$ is estimated by a differential value $di/dt$ as shown in FIG. 6, and the differential value $di/dt$ is fed back to the electrostatic deflection unit 8, to thereby reduce the settling time period $t_s$ (see Y. Takahashi et al., "Electron beam lithography system with new correction technigues", J. Vac. Sci. Technol. B 10(6), pp 2794–2798, November/December 1992).

In the electron beam deflecting apparatus of FIG. 5, however, since the operation of the differentiator requires time, the exposure time becomes longer.

Figure 7:
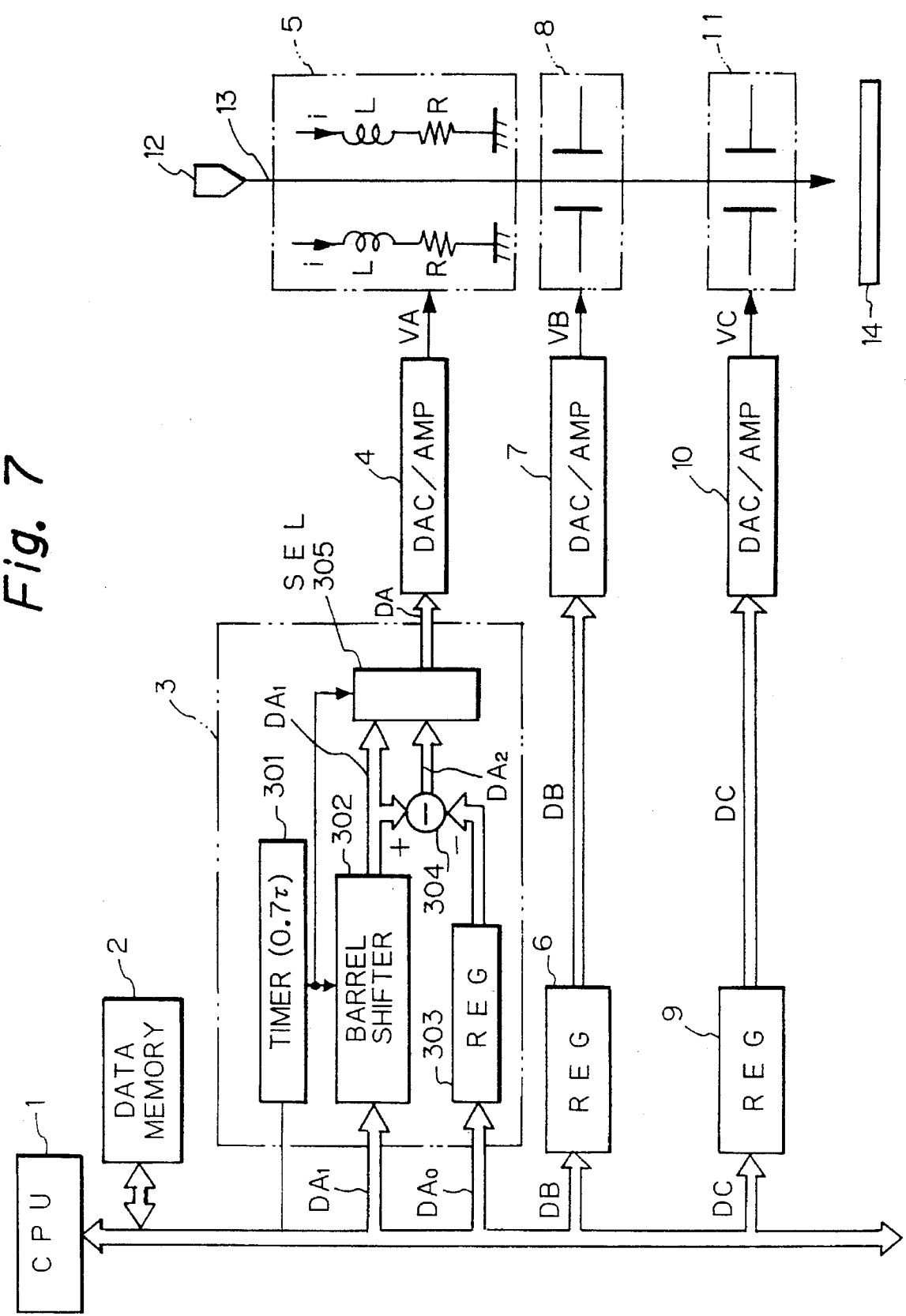
FIG. 7 is a block circuit diagram illustrating a first embodiment of the electron beam deflecting apparatus according to the present invention.

In FIG. 7, which illustrates a first embodiment of the present invention, a main deflection control circuit 3' is provided instead of the register 3 of FIG. 1.

The main deflection control circuit 3' includes a timer 301 for counting a time period, such as $0.7\tau$, a barrel shifter 302 for storing a current main deflection amount $DA_1$, a register 303 for storing a previous main deflection amount $DA_0$, a subtractor 304 for subtracting the output value of the register 303 from the output value of the barrel shifter 302, and a selector 305 for selecting one of the output value of the barrel shifter 302 and the output value of the subtractor 304.

The barrel shifter 302 and the selector 305 are controlled by the timer 301. That is, when the timer 301 counts the time period $0.7\tau$, a one-bit left shift operation is performed upon the barrel shifter 302, so that the output of the barrel shifter 302 is $2 \cdot DA_1$. Simultaneously, in this case, the selector 305 selects the output value of the subtractor 304. For example, if a one-bit left shift operation is performed upon the barrel shifter 302 whese input value $DA_1$ is 0001 (binary notation), the output thereof is 0010 (binary notation). That is, the output of the barrel shifter 302 is $2 \cdot DA_1$. Therefore, the output value of the selector 305 is $2 \cdot DA_1 - DA_0$.

On the other hand, when the value of the timer 301 becomes larger than the time period $0.7\tau$, the one-bit left shift operation of the barrel shifter 302 is not carried out, so that the output of the barrel shifter 302 is $DA_1$. Simultaneously, in this case, the selector 305 selects the barrel shifter 302. Therefore, the output of 20 the selector 305 is $DA_1$.

The operation of the CPU 1 of FIG. 7 will be explained with reference to FIG. 8. Here, the previous main deflection amount $DA_0$ corresponding to the current $I_0$ and the current main deflection amount $DA_1$ corresponding to the current $I_1$ are stored in the data memory 2.

At time 0, the CPU 1 reads the previous main deflection amount $DA_0$ from the data memory 2, and writes the amount $DA_0$ into the register 303. Also, the CPU 1 reads the current main deflection amount $DA_1$ from the data memory 2, and writes the amount $DA_1$ into the barrel shifter 302. Simultaneously, the CPU 1 initiates the timer 301 to count the time period $0.7\tau$. As a result, the content of the barrel shifter 302 is left-shifted by one bit, and therefore, the output value of the barrel shifter 302 is $2 \cdot DA_1$. Thus, the output value $DA_2$ of the subtractor 304 is $$DA_2 = 2 \cdot DA_1 - DA_0 \quad (3)$$

Thus, value $DA_2$ is selected by the selector 305 and is supplied to the driver 4. Therefore, as shown in FIG. 8, from time 0 to $0.7\tau$, a current $i_2$ corresponding to a main deflection amount $(2 \cdot DA_1 - DA_0)$ flows through the electromagnetic deflection unit 5. That is, $$i_2 = (I_2 - I_0) \cdot (1 - \exp(-t/\tau)) + I_0 \quad (4)$$

where $I_2 = 2 \cdot (I_1 - I_0) + I_0$
$= 2I_1 - I_0$

After time $0.7\tau$, the value of the timer 301 is larger than $0.7\tau$ to prohibit the one-bit left shift operation of the barrel shifter 302. As a result, the output value of the barrel shifter 302 becomes $DA_1$. Simultaneously, the selector 305 selects the output of the barrel shifter 302, and therefore, the main deflection amount $DA_1$ is supplied to the driver 4. Thus, a current i corresponding to the main delfection amount $DA_1$ flows through the electromagnetic deflection unit 5. That is, $$\neq I_1 \quad (5)$$

Figure 8:
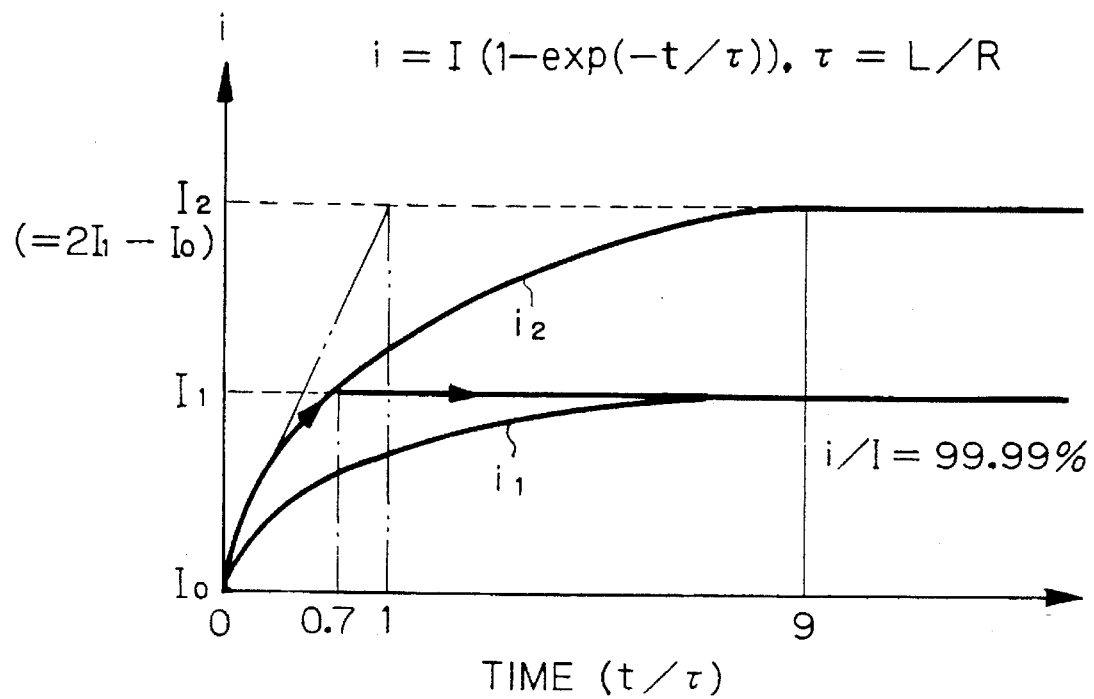
FIG. 8 is a timing diagram showing the operation of the apparatus of FIG. 7.

As shown in FIG. 8, the current i flowing through the electromagnetic deflection unit 5 is generally represented by $$i = I(1 - \exp(-t/\tau))$$

where I is determined by the main deflection amount DA. For example, $$i_1 = (I_1 - I_0) \cdot (1 - \exp(-t/\tau)) + I_0 \quad (6)$$

Therefore, when $t=9\tau$, the equation (6) is replaced by $$i_1 = (I_1 - I_0) \cdot (1 - 0.0001) + I_0$$
$$\approx I_1$$

Contrary to this, when $t=0.7\tau$, the equation (4) is replaced by $$i_2 = 2 \cdot (I_1 - I_0) \cdot (1 - 0.4966) + I_0$$
$$\approx I_1$$

Therefore, when the main deflection amount $2 \cdot DA_1 - DA_0$ is applied to the driver 5 for the time period $0.7\tau$, the settling time period can be remarkably reduced.

Note that, in the apparatus of FIG. 7, although the left shift operation of the barrel shifter 302 is one-bit, it is possible to perform a two-bit left shift operation, a three-bit left shift operation, and the like upon the barrel shifter 302. In this case, the output value of the barral shifter 302 is $4 \cdot DA_1$, $8 \cdot DA_1$, . . . . Alternatively, the CPU 1 or other calculators calculate the following:

$$DA_2 \alpha \cdot DA_1 - DA_0 \quad (7)$$

where $\alpha$ is a definite value larger than 1.

This value $DA_2$ can be used instead of the output value of the subtractor 304.

Figure 9:
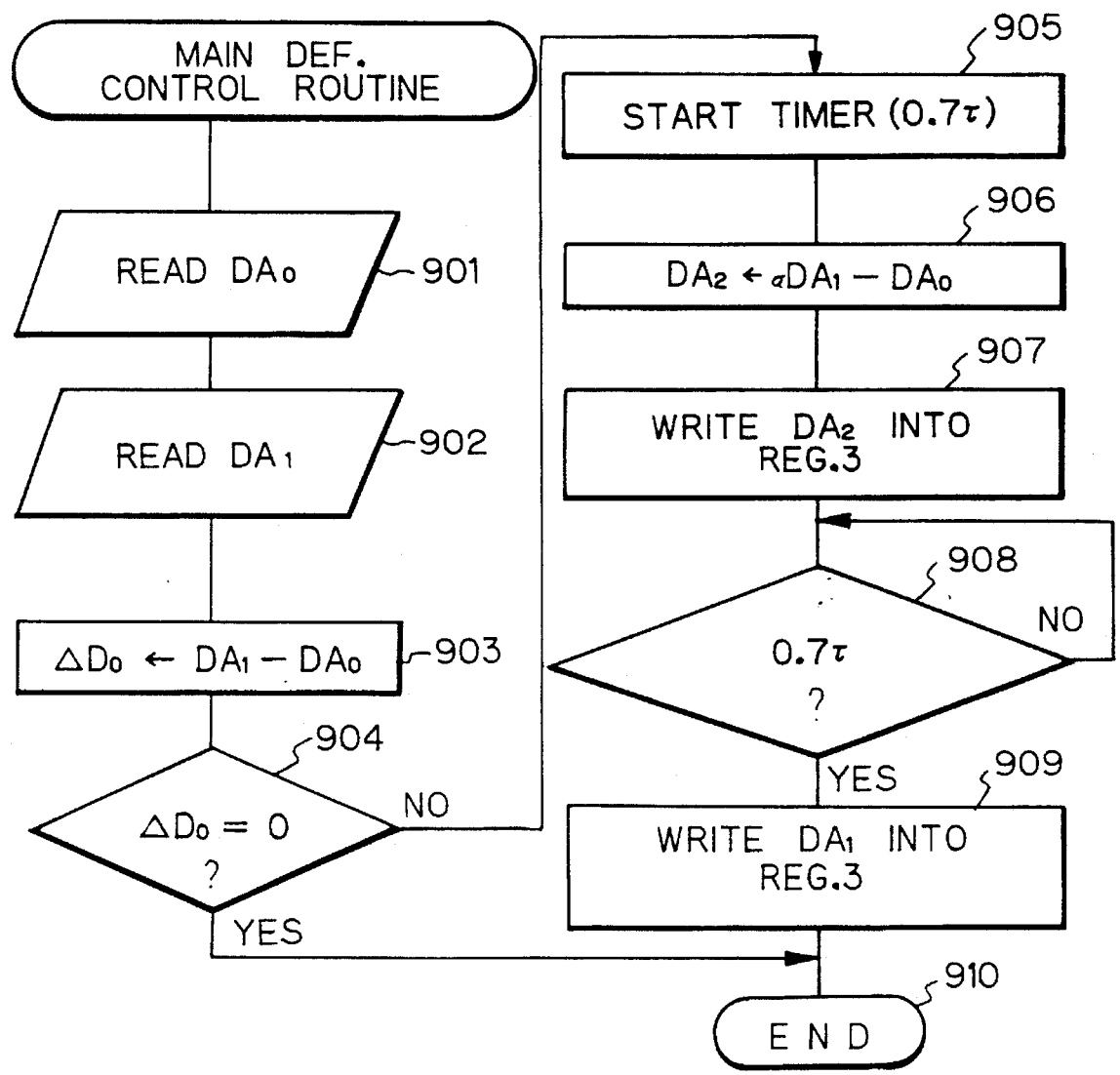
FIG. 9 is a flowchart showing a second embodiment of the present invention.

In FIG. 9, which illustrates a second embodiment of the present invention, a main deflection control routine stored in a read-only memory (ROM) (not shown) is shown. In this case, hardware for carrying out this routine uses the electron beam deflection apparatus of FIG. 1. Also, this routine is carried out at predetermined time periods.

At step 901, the CPU 1 reads a previous main deflection amount $DA_0$ from the data memory 2, and at step 902, the CPU 1 reads a current main deflection amount $DA_1$ from the data memory 2.

At step 903, the CPU 1 calculates a difference $\Delta D_0$ by $$\Delta D_0 \rightarrow DA_1 - DA_0$$

Then, at step 904, it is determined whether or not the difference $\Delta D_0$ is 0. As a result, when $\Delta D_0$ is 0, the control proceeds directly to step 910, thus completing this routine. In this case, the previous main deflection amount $DA_0$ is already stored in the register 3, and therefore, the position of electron beam 13 is not changed by the electromagnetic deflection unit 5. Otherwise, i.e., when the difference $\Delta D_0$ is not 0, the control proceeds to step 905.

At step 905, the CPU 1 initiates a timer (not shown) to count the definite time period $0.7\tau$.

Next, at step 906, the CPU 1 calculates the above-mentioned equation (7), i.e., $$DA_2 \rightarrow \alpha DA_1 DA_0$$

Then, at step 907, the CPU 1 writes the value $DA_2$ into the register 3.

Next, at step 908, it is determined whether or not the value of the timer is larger than $0.7\tau$, i.e., whether the time period $0.7\tau$ has passed. Only when the time period $0.7\tau$ has passed, does the control proceed to step 909, which writes the current main deflection amount $DA_1$ into the register 3.

Then, the routine of FIG. 9 is completed by step 910.

Thus, in the first and second embodiments, when the current main deflection amount $DA_1$ is larger than the previous main deflection amount $DA_0$, a larger main deflection amount than the amount $DA_1$ is used to drive the electromagnetic deflection unit 5. On the other hand, when the current main deflection amount $DA_1$ is smaller than the previous main deflection amount $DA_0$, a smaller main deflection amount than the amount $DA_1$ is used to drive the electromagnetic deflection unit 5. In both cases, the settling time period can be reduced.

Figure 10:
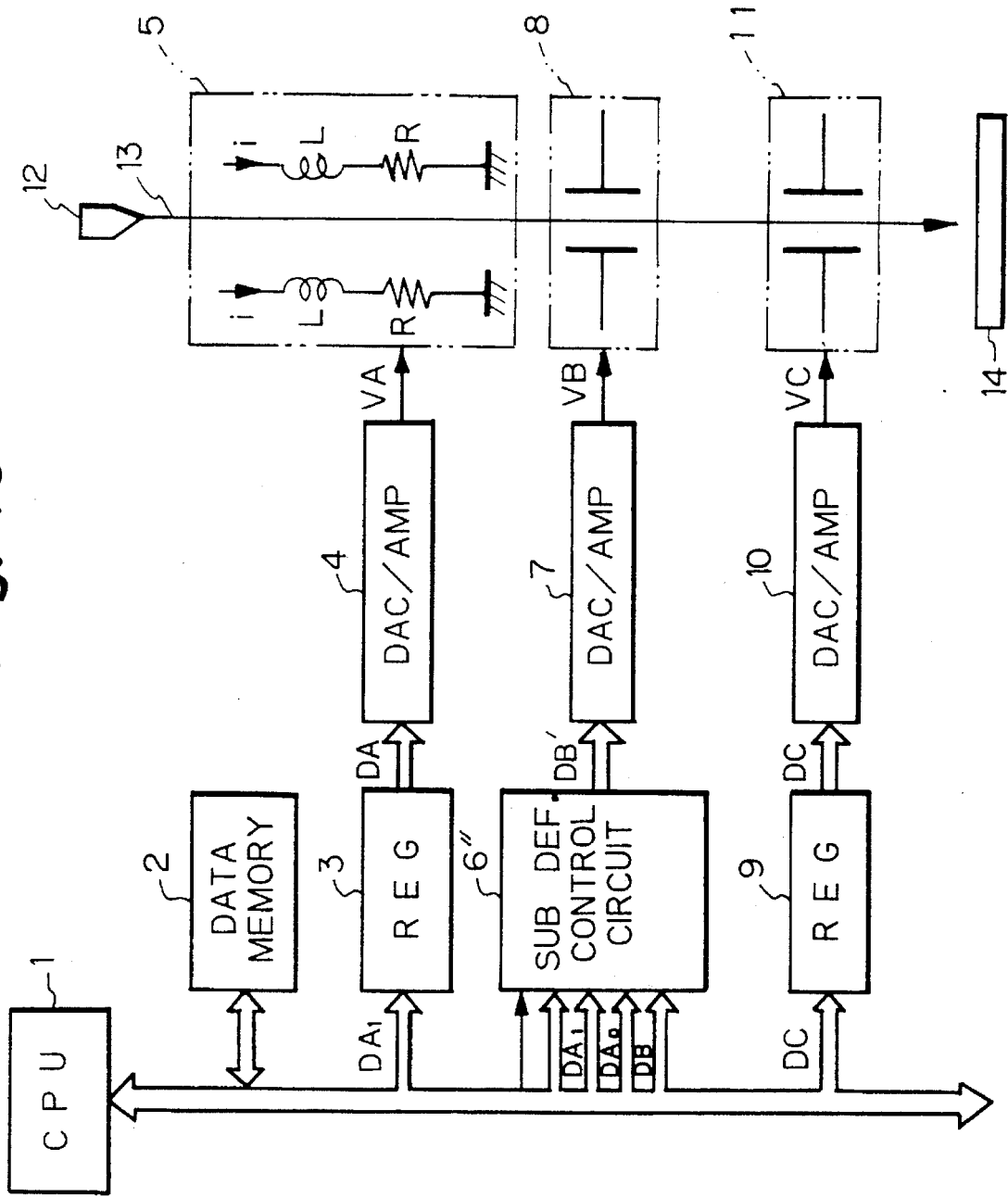
FIG. 10 is a block circuit diagram illustrating a third embodiment of the electron beam deflecting apparatus according to the present invention.

In FIG. 10, which illustrates a third embodiment of the present invention, a sub deflection control circuit 6'' is provided instead of the register 6 of FIG. 1, to thereby feed a deviation from main deflection control back to sub deflection control.

Figure 11:
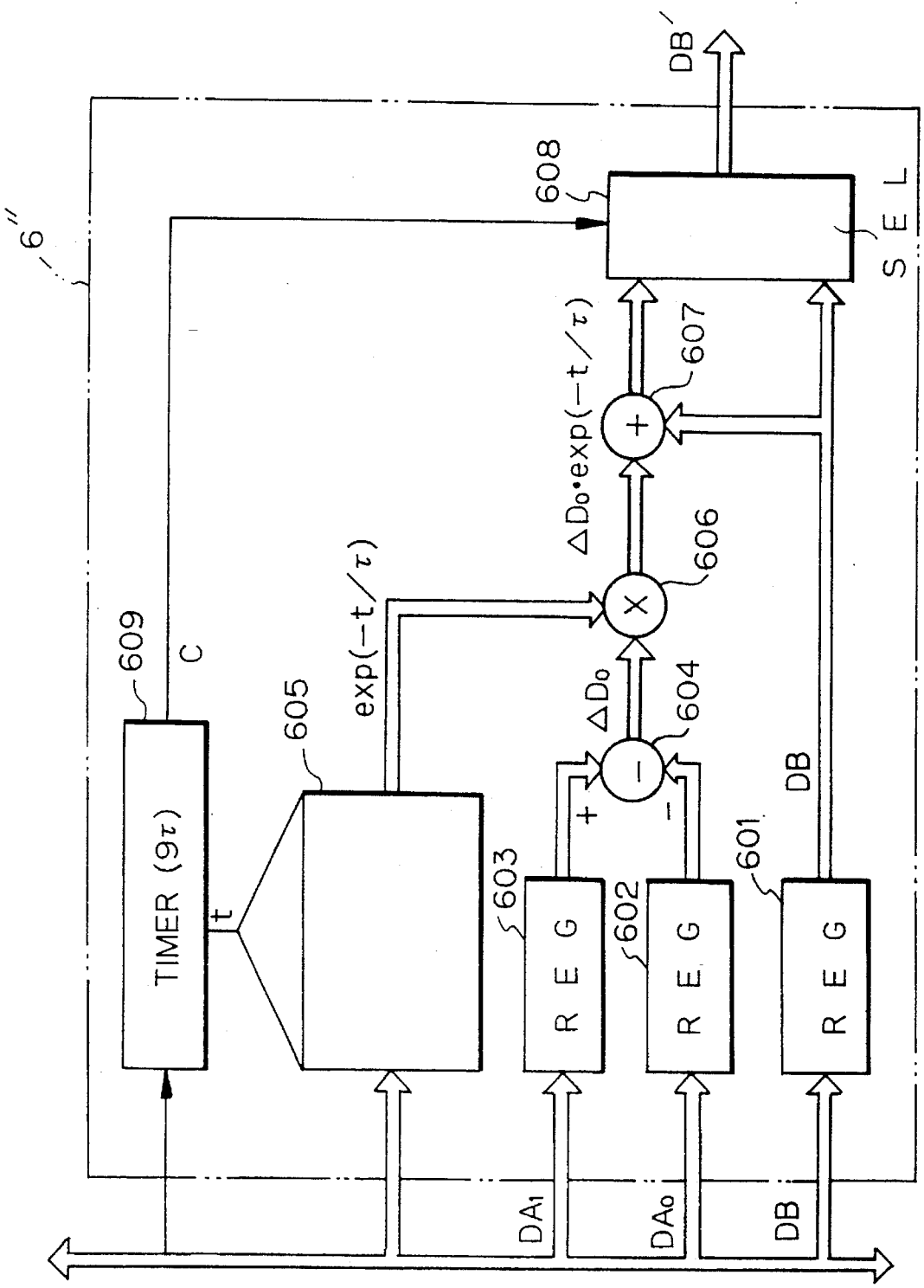
FIG. 11 is a detailed block circuit diagram of the sub deflection control circuit of FIG. 10.

The sub deflection control circuit 6'' is explained below in detail with reference to FIG. 11.

Reference numeral 601 designates a register corresponding to the register 6 of FIG. 1. Also, reference numerals 602 and 603 designate registers for storing a previous main deflection amount $DA_0$ and a current main deflection amount $DA_1$, respectively.

A subtractor 604 subtracts a value of the register 602 from a value of the register 603, i.e., calculates a difference $\Delta D_0$ by $$D_0 = DA_1 - DA_0.$$

A memory 605 generates a correction value of $\exp(-t/\tau)$ in accordance with a time t. Also, a multiplier 606 multiplies the output $\Delta D_0$ of the subtractor 604 by the output $\exp(-t/\tau)$ of the memory 605, i.e., generates $\Delta D_0 \cdot \exp(-t/\tau)$. Further, an adder 607 adds the output $\Delta D_0 \cdot \exp(-t/\tau)$ of the multiplier 606 to the output DB of the register 601, i.e., generates $DB + \Delta D_0 \cdot \exp(-t/\tau)$.

A selector 608 selects the output of the adder 607 or the output of the register 601, and transmits it as a sub deflection amount DB' to the driver 7.

Figure 12A:
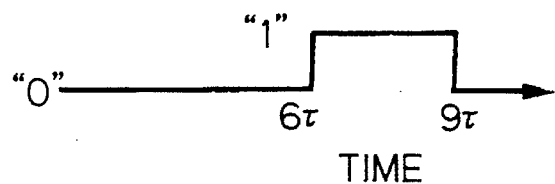
FIGS. 12A, 12B, 12C and 12D are timing diagrams showing the operation of the apparatus of FIG. 10.

The memory 605 and the selector 608 are controlled by a timer 609. That is, the timer 609 generates the time t and transmits it to the memory 605, so that the memory 605 generates a value $\exp(-t/\tau)$. Also, the timer 609 generates a control signal C as shown in FIG. 12A, and transmits it to the selector 608. As a result, when the control signal C is "1", the selector 608 selects the output of the adder 607, while, when the control signal C is "0", the selector 608 selects the ouput of the output of the register 601.

Figure 12B:
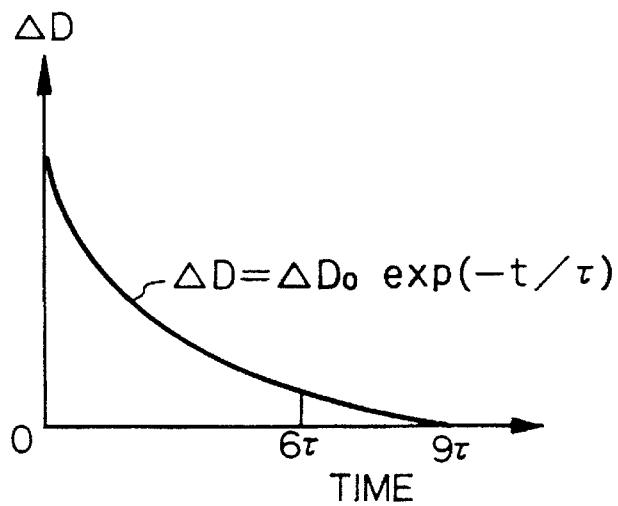
Figure 12C:
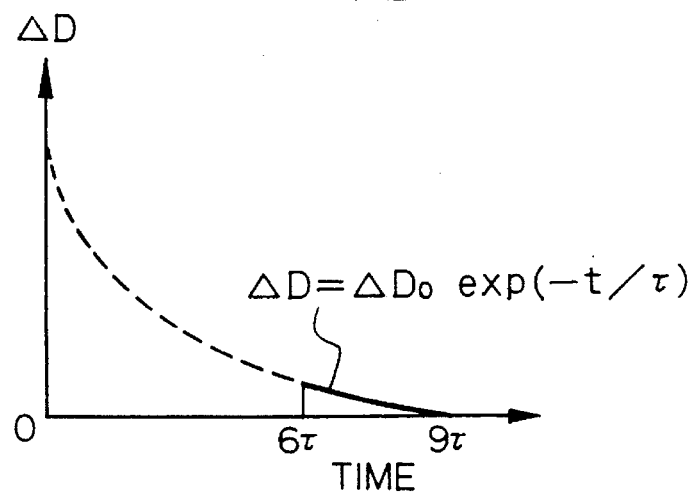
Figure 12D:
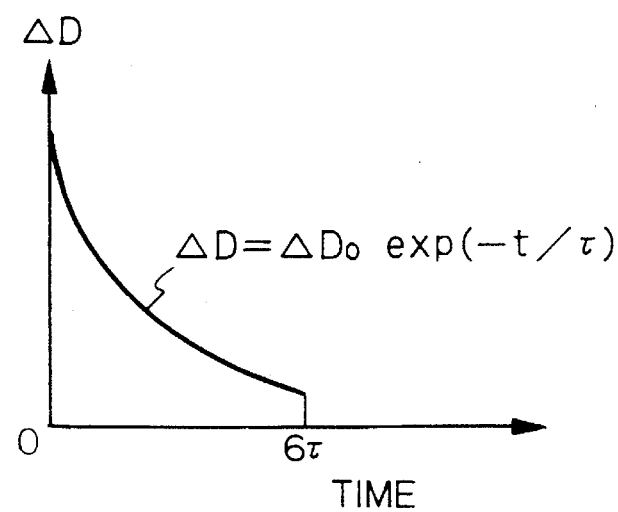

Therefore, when a distance $\Delta D$ between a previous position and a target position of the electron beam 13 is changed as shown in FIG. 12B, a corrected deflection amount $\Delta D$ as shown in FIG. 12C is fed back to the electrostatic deflection unit 8. As a result, an actual distance $\Delta D$ between the previous position and the aimed position of the electron beam 13 is changed as shown in FIG. 12D. Thus, in this case, the settling time period is represented by $6\tau$.

Figure 13:
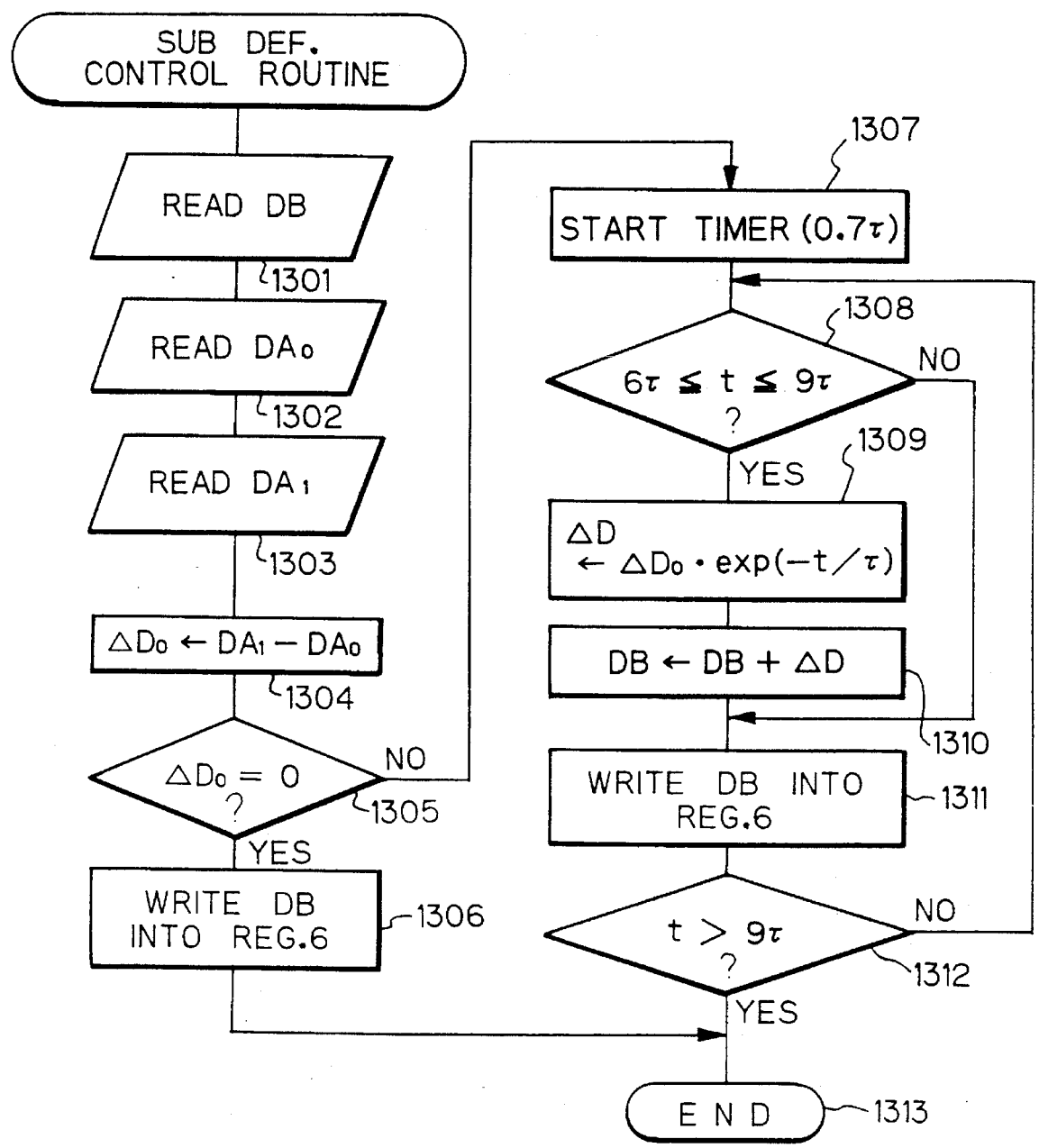
FIG. 13 is a flowchart showing a fourth embodiment of the present invention.

In FIG. 13, which illustrates a fourth embodiment of the present invention, a sub deflection control routine stored in the ROM (not shown) is shown. In this case, hardware for carrying out this routine uses the electron beam deflection apparatus of FIG. 1. Also, this routine is carried out at predetermined time periods.

At step 1301, the CPU 1 reads a current sub deflection amount DB from the data memory 2. Also, at step 1302, the CPU 1 reads a previous main deflection amount $DA_0$ from the data memory 2, and at step 1303, the CPU 1 reads a current main deflection amount $DA_1$ from the data memory 2.

At step 1304, the CPU 1 calculates a difference $\Delta D_0$ by $$\Delta D_0 \rightarrow DA_1 - DA_0$$

Then, at step 1305, it is determined whether or not the difference $\Delta D_0$ is 0. As a result, when $\Delta D_0$ is 0 the control proceeds to step 1306, which writes the sub deflection amount DB into the register 6. Then, the control proceeds to step 1313. Otherwise, i.e., when the difference $\Delta D_0$ is not 0, the control proceeds to step 1307.

At step 1307, the CPU 1 initiates a timer (not shown) to count the definite time period $9\tau$.

Next, at step 1308, it is determined whether or not $6\tau \leq t \leq 9\tau$, where t is the time of the timer. Only when $6\tau \leq t \leq 9\tau$, does the control proceed to step 1309 which calculates a corrected deflection amount $\Delta D$ by $$\Delta D \rightarrow \Delta D_0 \cdot \exp(-t/\tau)$$

Then, at step 1310, the CPU 1 calculates a sub deflection amount DB by $$DB \rightarrow DB + \Delta D.$$

Then, at step 1311, the CPU 1 writes the value DB into the register 6.

Next, at step 1312, it is determined whether or not the value of the timer is larger than $9\tau$, i.e., whether the time period $9\tau$ has passed. When the time period $9\tau$ has not passed, the control proceeds to step 1308 thus repeating the flow at steps 1308 through 1311. Otherwise, the control proceeds to step 1313.

Then, the routine of FIG. 13 is completed by step 1313.

Thus, in the third and fourth embodiments, since the deviation of the main deflection control is fed back to the sub deflection control, the settling time period can be reduced.

In the third and fourth embodiments, although the correction value $\exp(-t/\tau)$ is calculated in advance and is stored in the memory 605, it is possible to obtain the correction value experimentally by using correction patterns.

Figure 14:
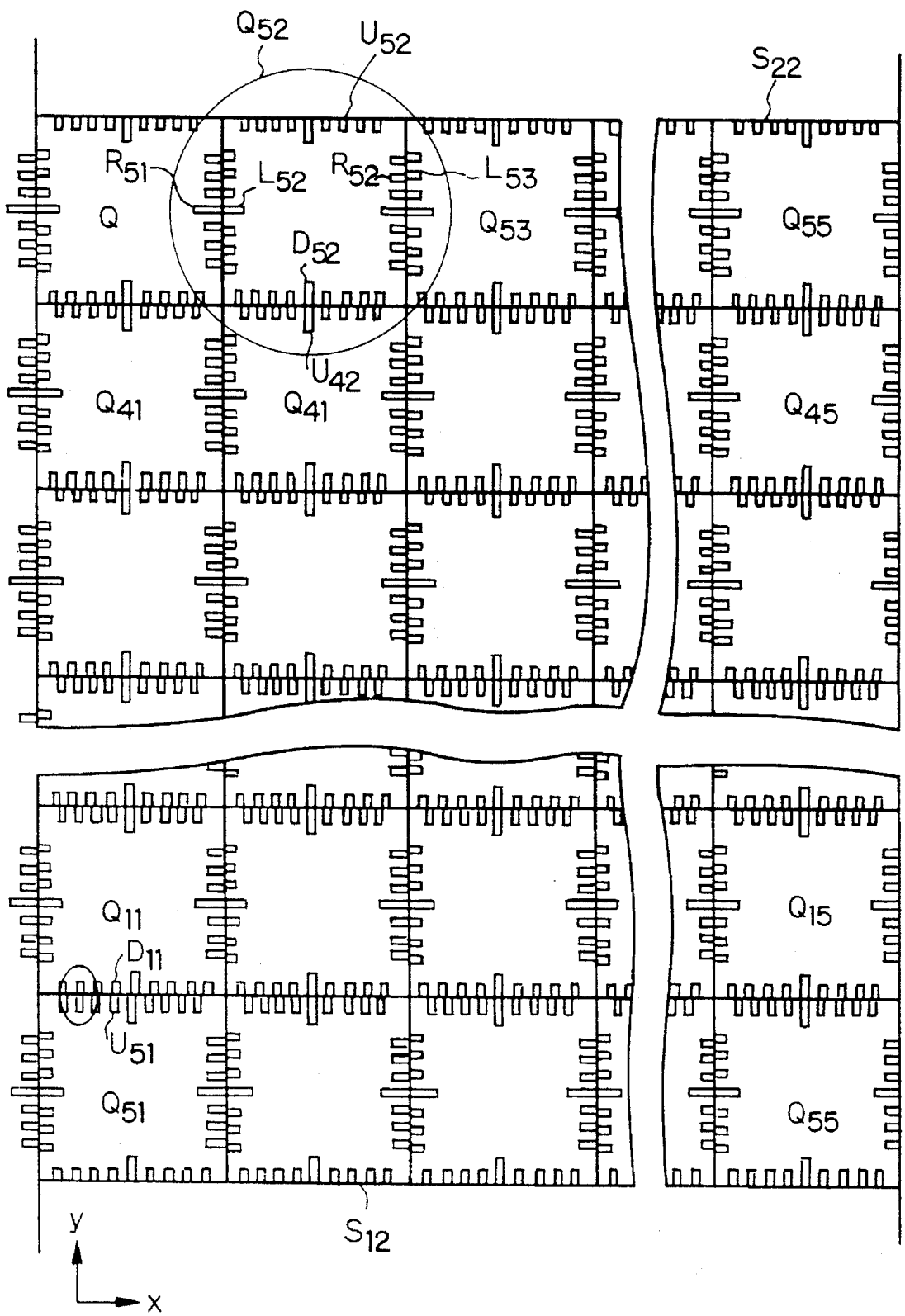
FIG. 14 is a diagram showing the sub deflection patterns of FIG. 10.

An example of obtaining the correction value is explained with reference to FIG. 14. In FIG. 14, a test pattern is comprised of 5×5 sub sub deflection areas $Q_{11}, Q_{12}, \ldots, Q_{55}$, each of which has line patterns (shots) on all sides. For example, the sub sub deflection area $Q_{52}$ has a line pattern $U_{52}$ on an upper end, a line pattern $D_{52}$ on a lower end, a line pattern $R_{52}$ on a right end, and a line pattern $L_{52}$ on a left end. In this case, a line pitch of one line pattern is a little different from a line pitch of another line pattern adjacent to the one line pattern. For example, the line pitch s of the line pattern $R_{52}$ is a little different from the line pitch p of the line pattern $L_{53}$, to satisfy the following:

$$l = u \cdot p = (ru \pm 1)s$$

where u is a positive integer, and r is a positive integer such as 1 or 2. As a result, the two adjacent line patterns form vernier calipers. For example, if s=1.00 µm, p=1.02 µm, and r=1, then u=50. This means that the number of lines for the pitch s is 50 and the number of lines for the pitch p is 51, and therefore, the length of the line pattern for the pitch s is 50 µm and the length for the line pattern for the pitch p is 51 µm. As a result, the resolution is 0.02 µm (=1.00/50).

For example, at time 6τ, assume that the electron beam 13 is irradiated onto the sub sub deflection area $Q_{11}$ of the sub deflection area $S_{22}$ of FIG. 14. In this case, the deviation $\Delta D_x$ in the x direction is detected by comparing the line pattern $D_{11}$ of the sub sub deflection area $Q_{11}$ with the line pattern $U_{51}$ of the sub sub deflection area $Q_{51}$ using an optical telescope. In FIG. 14, if a third line of the line pattern $D_{11}$ from the center thereof coincides with a third line of the line pattern $U_{51}$, the deviation $\Delta D_x$ in the x direction is (−3)×0.02 µm=−0.06 µm. If this deviation $\Delta D_x$ is written into the memory 605, the deviation $\Delta D_x$ is fed back to the electrostatic deflection unit 8. Also, if deviations at other times such as 6.5τ, 7.0τ, . . . are detected and are written into the memory 605, these deviations are corrected to reduce the settling time period. Further, if the above-mentioned correction of deviations is repeated, a high precision correction can be obtained.

Figure 15:
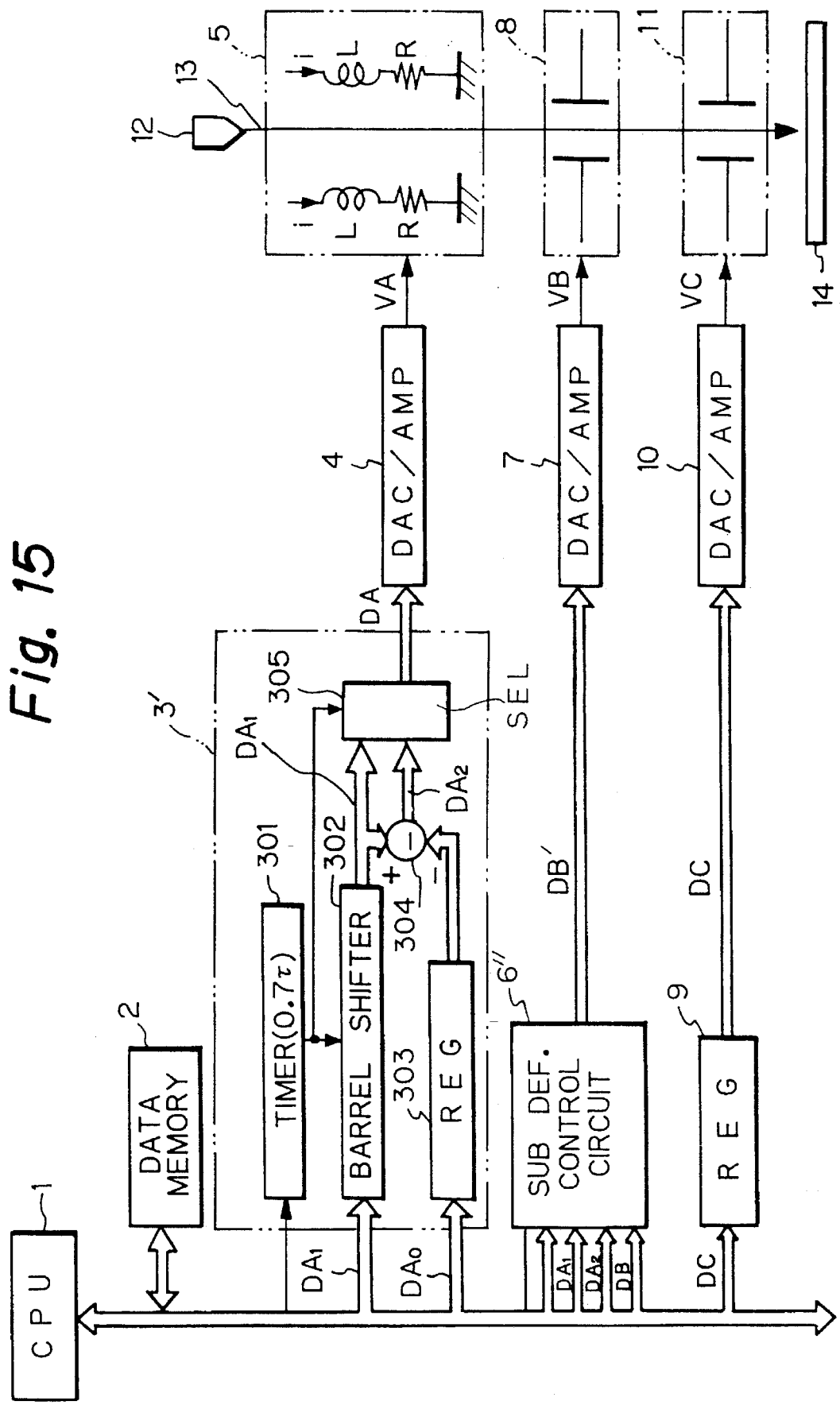
FIG. 15 is a block circuit diagram illustrating a fifth embodiment of the electron beam deflecting apparatus according to the present invention.

In FIG. 15, which illustrates a fifth embodiment of the present invention, the apparatus of FIG. 5 is combined with the apparatus of FIG. 10. In this case, the content of the memory 605 of FIG. 11 is determined experimentally by using a test pattern as shown in FIG. 14.

In the fifth embodiment, even after the electromagnetic deflection unit 5 driven by a larger or smaller main deflection amount than a current main deflection amount is completed, the deviation of the main deflection control is fed back to the sub deflection control. Therefore, the correction of the main deflection control can be more precisely carried out.

As explained hereinbefore, according to the present invention, since the deviation of an electron beam by an electromagnetic deflection unit is corrected, a settling time period therefor can be reduced.

We claim:

1. An electron beam deflecting apparatus comprising:

an electromagnetic deflection means for deflecting an electron beam;

a first driver for driving said electromagnetic deflection means in accordance with a main deflection amount;

means for generating a current main deflection amount;

means for calculating a difference between the current main deflection amount and a previous main deflection amount;

means for generating a corrected main deflection amount which is an opposite value of the previous main deflection amount with respect to the current main deflection amount and transmitting the corrected main deflection amount as the main deflection amount to said first driver only during a first definite time period when the difference is non-zero so as to reduce a settling time of said electromagnetic deflection means; and means for transmitting the current main deflection amount to said first driver to drive said electromagnetic deflection means after the first definite time period has passed.

2. An apparatus as set forth in claim 1, wherein said corrected main deflection amount generating means comprises:

a barrel shifter for storing the current main deflection amount and left-shifting the current main deflection amount by at least one bit; and a subtractor, connected to said barrel shifter, for subtracting the previous main deflection amount from an output value of said barrel shifter.

3. An apparatus as set forth in claim 1, wherein the first definite time period is approximately 0.7τ where τ is a time constant of said electromagnetic deflecting means.

4. An apparatus as set forth in claim 1, further comprising:

a first electrostatic deflection means for deflecting the electron beam;

a second driver for driving said first electrostatic deflection means in accordance with a sub deflection amount; and means for generating a corrected sub deflection amount dependent upon the difference and an exponential function of time and transmitting the corrected sub deflection amount as well as a current sub deflection amount to said second driver for a second definite time period when the difference is non-zero.

5. An apparatus as set forth in claim 4, further comprising:

a second electrostatic deflection means for deflecting the electron beam;

a third driver for driving said second electrostatic deflection means in accordance with a sub sub deflection amount for defining a test pattern including a plurality of rectangular areas each having line patterns at ends thereof, a first line pattern of one rectangular area being a little different from a second line pattern of another rectangular area opposing said one rectangular area to form vernier calipers, the corrected sub deflection amount being determined in accordance with a comparison of the line patterns opposing each other.

6. An electron beam deflecting apparatus comprising:

an electromagnetic deflection means for deflecting an electron beam;

a driver for driving the electromagnetic deflection means in accordance with a deflection amount;

a register for storing a previous deflection amount;

a barrel shifter for storing a current deflection amount;

a subtractor, connected to said register and said barrel shifter, for subtracting a value of said register from a value of said barrel shifter resulting in a corrected deflection amount;

a selector, connected to said barrel shifter and said subtractor, for selecting one of either said corrected deflection amount from said subtractor, or said current deflection amount stored in said barrel shifter, and transmitting it to said driver; and a timer, connected to said barrel shifter and said selector, for counting a definite time period to make said barrel shifter left-shift by at least one bit and make said selector select the said corrected deflection amount from said subtractor only during said definite time period.

7. An electron beam deflecting apparatus comprising:

an electromagnetic deflection means for deflecting an electron beam;

a register for storing a deflection amount;

a driver, connected to said register, for driving said electromagnetic deflection means in accordance with the deflection amount stored in said register;

a data memory for storing deflection data;

means for reading a previous deflection amount from said data memory;

means for reading a current deflection amount from said data memory;

means for comparing the current deflection amount with the previous deflection amount;

means for counting a definite time period if the current deflection amount is different from the previous deflection amount;

means for calculating a corrected deflection amount by $$DA_2 = \alpha \cdot DA - DA_0$$

where $DA_0$ is the previous deflection amount, $DA_1$ is the current deflection amount, and $\alpha$ is a constant larger than 1;

means for writing the corrected deflection amount into said register only when said counting means counts the definite time period so that said driver drives said electromagnetic deflection means in accordance with said corrected deflection amount; and means for writing the current deflection amount into said register when said counting means does not count the definite time period so that said driver drives said electromagnetic deflection means in accordance with said current deflection amount.

8. An electron beam deflection apparatus comprising:

an electromagnetic deflection means for deflecting an electron beam;

a first register for storing a current main deflection amount;

a first driver, connected to said first register and said electromagnetic deflection means, for driving said electromagnetic deflection means in accordance with the current main deflection amount stored in said first register;

a first electrostatic deflection means for deflecting the electron beam;

a second register for storing a sub deflection amount;

a third register for storing a previous main deflection amount;

a fourth register for storing the current main deflection amount;

a subtractor, connected to said third and fourth registers, for subtracting the previous main deflection amount from the current main deflection amount;

a memory for generating a correction value;

a multiplier, connected to said subtractor and said memory, for multiplying an output value of said memory by an output value of said subtractor;

an adder, connected to said second register and said multiplier, for adding an output value of said multiplier to an output value of said second register, resulting in a corrected sub deflection amount;

a selector, connected to said second register and said adder, for selecting one of said current sub deflection amount stored in said second register, or said corrected sub deflection amount from said adder;

a timer, connected to said memory and said selector, for counting a definite time period to make said memory generate the correction value in accordance with a counted value of said timer and make said selector select the corrected sub deflection amount from said adder only during said definite time period; and a second driver, connected to said first electrostatic deflection means, for driving said first electrostatic deflection means in accordance with an output value of said selector.

9. An apparatus as set forth in claim 8, further comprising:

a second electrostatic deflection means for deflecting the electron beam;

a third driver for driving said second electrostatic deflection means in accordance with a sub sub deflection amount for defining a test pattern including a plurality of rectangular areas each having line patterns at ends thereof, a first line pattern of one rectangular area being a little different from a second line pattern of another rectangular area opposing said one rectangular area to form vernier calipers, the corrected sub deflection amount being determined in accordance with comparison of the line patterns opposing each other.

10. An electron beam deflecting apparatus comprising:

an electromagnetic deflection means for deflecting an electron beam;

a first register for storing a main deflection amount;

a first driver, connected to said first register and said electromagnetic deflection means, for driving said electromagnetic means in accordance with the main deflection amount stored in said first register;

a first electrostatic deflection means for deflecting the electron beam;

a second register for storing a sub deflection amount;

a second driver, connected to said second register and said electrostatic deflection means, for driving said electrostatic means in accordance with the sub deflection amount stored in said second register;

a data memory for storing deflection data;

means for reading the current sub deflection amount from said data memory;

means for reading a previous main deflection amount from said data memory;

means for reading a current main deflection amount from said data memory;

means for comparing the current main deflection amount with the previous main deflection amount;

means for counting a definite time period if the current main deflection amount is different from the previous main deflection amount;

means for calculating a corrected deflection amount by $$\Delta D = (DA_1 - DA_0) \cdot \exp(-t/\tau)$$

where $DA_0$ is the previous main deflection amount, $DA_1$ is the current main deflection amount, $t$ is a time counted by said counting means, and $\tau$ is a time constant of said electromagnetic deflection means;

means for adding the corrected deflection amount to the current sub deflection amount, resulting in a corrected sub deflection amount, when a value of said counting means is within a special definite time period smaller than the definite time period;

means for writing the corrected sub deflection amount from said adding means as the sub deflection amount into said second register; and means for writing the current sub deflection amount as the sub deflection amount into said second register when the current main deflection amount is the same as the previous main deflection amount.

11. An electron beam deflecting apparatus comprising:

an electromagnetic deflection means for deflecting an electron beam;

a first register for storing a main deflection amount;

a first driver, connected to said first register and said electromagnetic deflection means, for driving said electromagnetic means in accordance with the main deflection amount stored in said first register;

a first electrostatic deflection means for deflecting the electron beam;

a second register for storing a sub deflection amount;

a second driver, connected to said second register and said electrostatic deflection means, for driving said electrostatic means in accordance with the sub deflection amount stored in said second register;

a second electrostatic deflection means for deflecting the electron beam;

a third driver for driving said second electrostatic deflection means in accordance with a sub deflection amount for defining a test pattern including a plurality of rectangular areas each having line patterns at ends thereof, a first line pattern of one rectangular area being a little different from a second line pattern of another rectangular area opposing said one rectangular area to form vernier calipers, a correction value being determined in accordance with a comparison of the line patterns opposing each other;

a data memory for storing deflection data;

means for reading a current sub deflection amount from said data memory;

means for reading a previous main deflection amount from said data memory;

means for reading a current main deflection amount from said data memory;

means for comparing the current main deflection amount with the previous main deflection amount;

means for counting a definite time period if the current main deflection amount is different from the previous main deflection amount;

means for calculating a corrected deflection amount by $$\Delta D = (DA_1 - DA_0) \cdot \beta$$

where $DA_0$ is the previous main deflection amount, $DA_1$ is the current main deflection amount, and $\beta$ is the correction value;

means for adding the corrected deflection amount to the current sub deflection amount, resulting in a corrected sub deflection amount, when a value of said counting means is within a special definite time period smaller than the definite time period;

means for writing the corrected sub deflection amount from said adding means as the sub deflection amount into said second register; and means for writing the current sub deflection amount as the sub deflection amount into said second register when the current main deflection amount is the same as the previous main deflection amount.

* * * * *

UNITED STATES PATENT AND TRADEMARK OFFICE
CERTIFICATE OF CORRECTION

PATENT NO. : 5,530,250
DATED : June 25, 1996
INVENTOR(S) : Hiroshi YAMASHITA

It is certified that error appears in the above-indentified patent and that said Letters Patent is hereby corrected as shown below:

Column 4, line 22, delete "$(I_1-I_0)$ and insert -- $(I_1-I_0)$ --.

Column 6, line 15, before " $\neq I_1$" insert -- i --.

Column 7, line 12, delete "$aDA_1$" and insert -- $a \cdot DA_1$ --.

Column 7, line 47, delete "$D_0$" and insert -- $\Delta D_0$ --.

Signed and Sealed this

Fifth Day of November, 1996

*Attest:*

BRUCE LEHMAN

*Attesting Officer*     *Commissioner of Patents and Trademarks*